United States Patent [19]
Laass

[11] 4,039,937
[45] Aug. 2, 1977

[54] ACOUSTIC TEST APPARATUS FOR ELECTRICAL NETWORKS INCLUDING MULTI-PHASE POWER SYSTEMS

[75] Inventor: Heinz Laass, Pfungstadt-Hahn, Germany

[73] Assignee: Taco-Tafel GmbH & Co., KG, Esslingen, Germany

[21] Appl. No.: 687,156

[22] Filed: May 17, 1976

[30] Foreign Application Priority Data

June 4, 1975 Germany ............................ 2524681
Jan. 16, 1976 Germany ............................ 2601475

[51] Int. Cl.² ...................... G01R 19/14; G01R 31/02
[52] U.S. Cl. .......................................... 324/51; 324/86; 324/108; 324/133
[58] Field of Search .................. 324/51, 133, 86, 108; 340/255, 253 Q; 317/47, 48

[56] References Cited

U.S. PATENT DOCUMENTS

| | | | |
|---|---|---|---|
| 2,130,573 | 9/1938 | Wideroe | 324/133 X |
| 2,566,726 | 9/1951 | Huse et al. | 324/133 |
| 2,634,404 | 4/1953 | Carmichael | 324/133 X |
| 2,993,172 | 7/1961 | Karlicek | 324/133 |
| 2,999,231 | 9/1961 | Kusters et al. | 340/255 |
| 3,492,567 | 1/1970 | Rissolo | 324/51 |
| 3,764,904 | 10/1973 | Drexler | 324/86 |
| 3,872,384 | 3/1975 | Laass | 324/133 X |
| 3,947,759 | 3/1976 | Briggs | 324/51 |

OTHER PUBLICATIONS

Stubbings, G. W., A Modified Varley Phase Sequence Test *Instruments,* Feb. 1934, p. 27.
Wider, M. F., Shows Phase Rotation of Secondary Circuits Electrical World, July 6, 1946, pp. 106 and 110.

*Primary Examiner*—Gerard R. Strecker
*Attorney, Agent, or Firm*—Flynn & Frishauf

[57] ABSTRACT

A local power source, such as a battery, is connected to a tone generator oscillator circuit which includes an audio reproducer. The tone generator includes a voltage sensing element such as a dark-resistance photoconductor, a resistor, or a Zener diode, at which the voltage is sensed when connected in a phase sequence circuit network or other network to be tested. The output tone, whether present or not, is indicative of a predetermined phase sequence of connection of test terminals. A transfer switch can connect the oscillator directly or through dropping resistors or non-linear resistances such as a Zener diode to the test terimals so that the test terminals can also be used to test for external resistance, short circuits, or polarity of applied voltages in the network which, depending on their polarity, may introduce external voltages, thus modifying the tone of oscillation of the tone generator. The output of the tone generator thus will be indicative of input conditions at the test terminals for universal measurement of phase sequence, input resistance, continuity at input terminals, or applied voltages and their characteristics, namely whether a-c or d-c, and if so, their polarity.

30 Claims, 5 Drawing Figures

ACOUSTIC TEST APPARATUS FOR ELECTRICAL NETWORKS INCLUDING MULTI-PHASE POWER SYSTEMS

Cross reference to patent in similar field: U.S. Pat. No. 3,872,384, issued Mar. 18, 1975, by the inventor hereof and assigned to the assignee of the present application.

The present invention relates to a test instrument particularly for use with power systems having an acoustic output which is universally applicable to test for phase sequence of power systems, typically three-phase systems, but which can readily be modified to additionally provide output indications of input resistance or the nature of input power applied to test terminals, namely whether a-c or d-c and, if so, the polarity of the d-c connection.

Various types of test systems and apparatus have been proposed to test for various parameters and conditions of circuits being connected to test terminals. Most apparatus of this type provide for visual indication, that is, optical read-out or optical indication providing information regarding phase sequence (also referred to as phase rotation) of multi-phase terminals, typically three-phase connections, and of other circuit parameters or conditions arising in electrical equipment. Digital or analog instruments are used and, to provide an indication of phase sequences, rotation disks or lamps, provide output indications of the respective phase sequences of test terminals connected to the terminals of a power source.

The phase sequence or phase rotation of three-phase networks can be determined by using bridge networks in which the phase angle of inter-phase voltages is known; for example for a three-phase network, it is 120°-electrical. A known bridge network utilizes the combination of resistance arms and reactive impedance arms to provide a phase-shifted output across the diagonal of the bridge. If the phase angle of one half of the bridge is rotated by 60°-electrical by a capacitor, for example, the resulting voltage across the diagonal of the bridge will be zero or null. This condition is true only for a predetermined phase sequence of three input connections of the bridge. If only two connections of the bridge are energized, or if the phase sequence is different from the predetermined connection, a voltage will appear across the diagonal of the bridge and this voltage can be indicated, for example by a measuring instrument or by a lamp. Frequently, the lamp is a glow tube have a certain threshold voltage. The glow tube or glow lamp then will light under all conditions if the resulting bridge voltage exceeds the ignition or trigger voltage of the glow lamp.

Ordinary three-phase power supply terminals connected to the test instrument will provide an output indication at the glow lamp if only two phase conductors are connected, that is, if the third phase conductor should accidentally or deliberately have been left unconnected, or if the connection is a star connection in which the third phase conductor was inadvertently connected at the center or star point. The glow lamp will also light if the phase sequence does not correspond to the phase sequence for which the particular apparatus is designed, usually as indicated by multi-ciolored test terminals which, when properly connected to a three-phase network of proper phase rotation, will not provide a glow lamp indication. Thus, in case the phase sequence of the power connected to the test terminals is "correct" and all connections are properly made, the bridge voltage will be insufficient to cause the glow lamp to light.

Visual indicators, whether of the instrumentation (digital or analog) or on-off (glow lamp or the like) type have the disadvantage that the indication instrument must be observed by the user while the user is also applying test prongs or test terminals to the live power network. The user, therefore, has to first direct his attention to properly connecting the test prongs or test terminals, and then divert his attention from such proper connection to the test instrument itself. This involves some danger of inadvertent shift of the terminals on the power network and causes additional time in the measurement since connection and observation are indepent sequential steps.

It is an object of the present invention to provide a test apparatus in which various parameters and circuit conditions, particularly phase sequence and proper power supply connection, as well as resistance or open-circuit or counter-voltage conditions can be measured on a single instrument, and in which the output is acoustic and immediately available upon connection of the test terminal, so that visual attention by the user from the test step itself need not be diverted.

Safety in testing, particularly of commercial lighting as well as power line voltages, requires undivided attention by the user to the test termainals being connected to live power networks. The apparatus permits continuous observation of the contact points of the test terminals or test prongs, since the output result of the test is acoustically transmitted to the user, so that he need not divert his visual observation of the test prongs or test terminals from the power network at any time. This is very important for safety since, usually, two of the test lines or test prongs are manually held to touch conductors which may have lethal voltages thereon. The test prongs or test leads which are manually held are usually not permanently connected. One of the test prongs may be connected by a so-called "alligator" clip but the other test prongs are usually only temporarily manipulated and connected.

Testing is speeded since attention need not be diverted in the interval between making a contact and indication on the test instrument. The audible output thereof is independent of the direction of vision of the user.

The apparatus permits not only testing for phase sequence of power networks, but additionally provides the capability, by means of a simple transfer switch, to use the apparatus to test for continuity, or foreign voltages; the apparatus, therefore, is highly versatile. Only a single apparatus is needed, resulting in high efficiency and utility thereof since multiple types of instruments to test for different circuit conditions or parameters are not required. The acoustic indication further permits supervision of the test result by third persons or users who are outside of the field of vision of the apparatus. The test apparatus may, for example, be placed on a visually obscured shelf or position and still provide output indicative of certain test operations.

It is an object of the present invention to provide an acoustic-output indicating instrument, for example an acoustic-output voltage or continuity tester which is so arranged that it additionally is capable to test for phase sequence in multi-phase, for example three-phase networks, to recognize predetermined phase sequences. The test instrument should be versatile and permit various tests to be made. It is an ancillary object to provide an arrangement for use in combination with existing acoustic-type indicator instruments to determine, selectively, phase sequence as well as data referring to other network parameters.

SUBJECT MATTER OF THE PRESENT INVENTION

Briefly, a tone generator oscillator circuit is powered by a power source such as a local battery, and includes an audio reproducer such as a small loudspeaker. A voltage-reponsive element is connected in circuit with the tone generator; the voltage across the element, or the input resistance, determines the condition of oscillation of the tone generator oscillator, that is, whether it is oscillating at all and, if so, the frequency of oscillation thereof which will be reproduced by a tone of a certain pitch by the audio reproducer loudspeaker. A phase-shifting circuit is connected to two test input terminals forming a first combination of phase testing terminals. The voltage sensitive, or responsive element senses presence or absence of voltage as phase-shifted, similar to the sensing of a voltage in a bridge circuit, and in turn controls the oscillation of the tone generator.

The term "bridge circuit" will be be used, although not strictly in the sense of a Wheatstone bridge. The action is similar to the balancing of voltages in parallel circuits. In the application to three-phase networks, balance of output from two phases can be obtained by phase shifting. The circuit may therefore also be termed a "balancing circuit" or a comparison circuit.

In one embodiment, the voltage-responsive element is a detection element having an optical output which is optically coupled with a dark-resistance photoconductor. If the phase sequence connected to the test input terminals is in one direction, the phase-shifting circuit will provide a null or zero output to a glow lamp which will remain extinguished and hence not affect the resistance of the dark-resistance photoconductor. The oscillator will not oscillate. Silence of the instrument thus is indicative of one phase connection. At another phase connection, a voltage will be derived across bridge terminals, causing the glow lamp to emit light, which changes the resistance of the photoconductor to such an extent that the oscillator will oscillate and a tone therefrom will be indicative of another phase sequence or of failure of a balancing third phase to null the bridge to which the phase detection element is connected.

In accordance with a feature of the invention, a transfer switch is provided to selectively connect either the dark-resistance photoconductor or a resistance network to the oscillator so that the oscillator can be used, additionally, to determine the resistance of an externally connected circuit. A Zener diode, connected in circuit with the local power source permits, additionally, determination of the presence of external voltages. If the polarity of the external voltage is in one direction, the oscillator will oscillate; if in another direction, the local battery voltage will be effectively bucked, thus causing failure of the oscillator to oscillate. The instrument, therefore, functions as a polarity indicator. Connection of an alternating current voltage will superimpose a modulation on the oscillation of the tone generator, thus providing a beat output which, again, is indicative of the presence of a third condition of an external circuit, namely of an a-c voltage.

In accordance with a feature of the invention, the bridge circuit is connected to provide a terminal which either has, or does not have a resulting bridge voltage applied if the phase sequence is in the one, or the other direction. Due to manufacturing tolerances, it is difficult to consider voltages either as being "present" or "absent" so that, in a practical embodiment, voltages above or below a certain threshold value must be considered. The acoustic instrument, in accordance with a feature of the invention, is connected in series with a voltage controlled semiconductor element, such as a Zener diode, and the two free ends of this series connection are connected to the terminals of the indicator branch of the bridge circuit. An acoustic signal will then be obtained if the bridge voltage does not pass below the threshold value of the voltage-controlled semiconductor element. Ideally, the voltage sensing at the bridge could be carried out by a resistor; due to the aforementioned tolerances, however, the voltage-controlled element is a preferred embodiment.

The indicator branch of the bridge circuit can be loaded to a lesser extent if the bridge circuit is formed by a voltage divider including, for example, the series circuit of a resistor and a glow lamp, or of several resistors, in which the free ends of the series circuit of the voltage-controlled semiconductor element and the acoustic test instrument are connected to the terminals thereof, or one terminal is connected to a tap point of the voltage divider.

The acoustic test instrument can also be utilized to test continuity if the response characteristic with respect to high resistances is limited. The voltage-controlled element can then be omitted if precautions are taken so that the acoustic test instrument does not respond already with respect to the resistances within the bridge circuit itself. In accordance with another feature of the invention, the voltage-controlled element can be replaced by a resistor which prevents response of the test instrument when connected to a closed circuit.

The instrument can readily be constructed with transfer switches in which the bridge circuit used to test for phase sequence is disabled or disconnected, so that the test instrument can be used solely to test for voltages or continuities; two of the connections of the test instrument can be used to test for phase sequence.

The phase testing features can be constructed as a separate attachment to be used with suitably constructed test instruments, matching the resistance ranges of the bridge circuit, so that a versatile instrument or an extension of an already existing instrument is provided.

The test apparatus thus combines those test elements which are frequently utilized when working with electrical networks, and particularly with power supply systems, in which a single test instrument provides the necessary and customarily required test features. This has a substantial advantage regarding initial costs of the instrument, as well as availability, transportation, and use, since only a single instrument need be provided with multiple functions. The outstanding advantage of the instrument, however, is the safety of its use. Customarily, such instruments are used in the testing of networks at power voltages and frequencies. The conductors to be tested may well be live and have voltages which are potentially lethal. The instrument permits the user to direct his entire visual attention to the connection of the test prongs or test leads, since the test result is acoustically indicated. The user, therefore, need not divert his field of vision from his hands, potentially close to energized electrical conductors, in order to obtain a test result.

The invention will be described by way of example with reference to the accompanying drawings, wherein.

Figure 1:
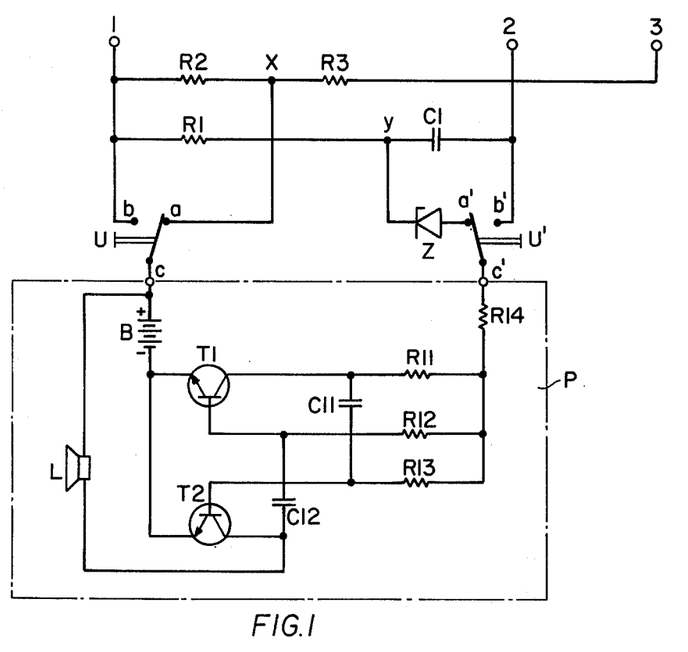
FIG. 1 is a schematic circuit diagram of a test instrument in accordance with the present invention.

Referring first to FIG. 1: Three test terminals 1, 2, 3 are connected to an open bridge circuit formed by resistors R1, R2, R3 and capacitor C1. Resistors R2, R3 are series-connected between phase terminals 1 and 3, and have a common junction $x$. Resistor R1 and capacitor C1 are series-connected between phase terminals 1 and 2 and have a common junction $y$. The resistances of the resistors and the capacity of the capacitor C1 are so matched that capacitor C1 will effect a phase shift by 60°. If the phase sequence is 1-2-3, then the voltage between terminals $x$ and $y$ will be a minimum, due to the phase rotation by the capacitor C1 by 60°. This minimum voltage condition is indicated by indicator P which tests for voltage and electrical continuity across its input termainals $c, c'$.

The acoustic test apparatus P is a multivibrator circuit having two transistors T1, T2, two capacitors C11, C12, and four resistors R11, R12, R13, R14, connected as shown in FIG. 1. A local battery B supplies current to the multivibrator. The values of the resistors and of the capacitors are so adjusted with respect to each other that, if the terminals $c, c'$ are electrically connected, an output tone will be generated at loudspeaker L which is in the humanly audible range.

Terminals $c, c'$ of the acoustic indicator P are connected, selectively, by transfer switches U, U′ either to phase terminal 1, or to terminal $x$ for the output terminal $c$, or through a Zener diode Z to the junction terminal $y$ or to the phase terminal 2, respectively, upon relative switch-over of either of the switches U, U′. The fixed contacts of the transfer switches U, U′ have been given notations $a, b$ and $a', b'$, respectively.

Operation: Upon electrical connection of terminals $c, c'$, which connection must have a resistance below a predetermined value, the multivibrator T will oscillate and an audible tone of a predetermined pitch will be generated. The multivibrator can be additionally energized if the terminals $c, c'$ are connected to a voltage source which either increases the voltage of battery B or bucks the voltage of battery B only partially, that is, does not entirely remove operating potential from the multivibrator P.

The transfer switches U, U′ permit selective connection of the test instrument either for testing of direction of phase rotation, or for voltage or continuity testing. If the transfer switches U, U′ connect terminals $c, c'$ to the switch terminals $a, a'$, as indicated in FIG. 1, then the test instrument P is directly connected to the junction terminals $x, y$ between resistors R2, R3 and between resistor R1 and capacitor C1, respectively, with the Zener diode Z interposed in the connection between terminals $y$ and $a'$. The relative phase rotation of a three-phase voltage applied to terminals 1, 2, 3 will determine if a voltage will appear across the terminals x, y that is, if a balance voltage across terminals x, y will be present. If the phase sequence is 1-2-3, then the voltages, at points $x$ and $y$, as in a bridge circuit, are in balance and no resulting voltage will occur between terminals $x, y$, if the resistors and the capacitor are accurately matched and adjusted. In practical commercial production, however, this is difficult to obtain due to tolerances between individual resistor and capacitor elements. This voltage will, however, be much less than that which will occur between the terminals $x$ and $y$ if the phase rotation is reversed, that is, 1-3-2 or if one of the three phase terminals will not have an a-c voltage appear thereat, or one of the terminals is connected to the center or "neutral" connection of the four-wire star-connected three-phase networks.

The voltage-controlled semiconductor element Z ensures that the voltages across junctions $x$ and $y$ must exceed a certain minimum value before the multivibrator in test instrument P can become affected. The breakdown or triggering voltage of the Zener diode Z is preferably so selected that it is somewhat higher than the voltage of the battery B of the test multivibrator P, so that, if no a-c is applied to the phase terminals 1, 2, 3, the network of the test multivibrator P is not closed through the resistors R1 and R2 of the bridge network itself.

The test for phase rotation, thus, will be: If the phase rotation is 1-2-3, no or low voltage will appear across terminals $x, y$ and in the indicated switch position of transfer switch U, U′, the loudspeaker L will be silent. If the phase rotation, however, is 1-3-2, a voltage will be available across terminals $x, y$ in excess of the Zener voltage of Zener diode Z, and output will be obtained from loudspeaker L.

If the transfer U is changed over to connect terminal $c$ to terminal $b$, and transfer switch U′ is changed over to connect terminal $c'$ to terminal $b'$, measurement from phase sequence to external circuit conditions can be made. An output will be obtained from tone generator P indicative of continuity of a circuit connected to terminals 1, 2, the resistance of such a circuit, or the presence of extraneous voltages, by detecting whether tone generator P oscillates, that is, provides an output, and the pitch thereof. In a first mode of operation, terminals 1 and 2 alone are used, terminal 3 not being used at all. If the element or circuit to be tested is subject to damage by current flow from the local battery B, for example, or if the elements to be tested are suspected of being delicate, then terminals 2 and 3 can be used, the resistors R2, R3 functioning as an additional current limiting resistor.

The resistance of an externally connected circuit will determine the current flow from local battery B through the transfer switch terminals $b, c$ and $b', c'$. If desired, a coupling resistor can be inserted in series with terminal $b'$ and the junction of capacitor C1 and terminal 2. The pitch of the tone from loudspeaker L will be representative of the input resistance across terminals 1, 2. Likewise, should terminals 2, 3 be used, the resistance across those terminals will determine the pitch of loudspeaker L as modified by the resistance of the resistors R2, R3.

The apparatus can additionally be used to determine the presence and nature of an externally connected voltage, connected between terminals 1, 2 or between terminals 2, 3, respectively.

Depending on the polarity of an externally applied voltage, for example between terminals 1, 2, it will either add or subtract from battery voltage B. The tone generator p thus will either oscillate at reduced strength, full strength, or at excessive rate, with a pitch determined by the external circuit parameters. If, however, the input voltage is reversely poled, tone generator p will fail to oscillate. If the input voltage is an alternating voltage, tone generator p will oscillate, modulated by the frequency of the applied alternating voltage. The output from loudspeaker L will, therefore, be additionally modulated by the input voltage, to provide a low frequency output.

The pitch of the tone and the nature of the tone emitted from loudspeaker L, therefore, are indicative of the nature of an externally applied voltage and, if d-c, of its polarity; or of external circuit conditions of a network connected to the respective terminals 1, 2 or 2, 3.

For certain embodiments it may be desirable to include an additional Zener diode connected across terminals b-b', for example by means of a separate switch terminal on either one of the transfer switches. If an externally connected voltage is of a polarity so that this auxiliary Zener diode (not shown) operates at its forwardly conductive voltage, then this voltage will, effectively, be additional and in series with the local battery B. The tone generator T will then operate at full strength. If the input voltage is, however, reversely poled, then the Zener voltage across the auxiliary Zener diode, not shown, will be effective across the terminals c, c' to completely suppress and block operation of the tone generator P. An alternating voltage connected across terminals 1, 2 or 2, 3, respectively, will cause such an auxiliary Zener diode, not shown, to be alternately blocking or conducting.

Alternatively, the arrangement can be so made that only transfer switch U is changed over to connect terminal b and c, whereas switch U' is permanently connected between terminals a' and c' and alternatively between terminals a' and b', so that the Zener diode Z, series connected through the resistor R1 of the bridge circuit provides the reference voltage level with respect to external voltages connected to terminals 1, 2 or 2, 3, respectively.

Figure 2:
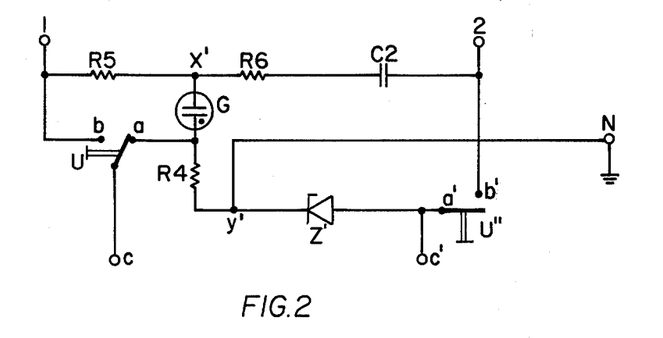
FIG. 2 is a fragmentary diagram illustrating a different form of phase-sensitive bridge network.

FIG. 2 shows only the bridge circuit in a modified form; the terminals c, c' are connected to the audio-output circuit P which is identical to that described in connection with FIG. 1.

The bridge circuit of FIG. 2 has two series connected resistors R5, R6 and a capacitor C2. The free ends of the series circuit are connected to phase terminals 1, 2 of an external three-phase system; the third connection of the three-phase network may be either a third terminal or a neutral or center connection of a star-connected three-phase network, having terminal N, which is connected to terminal y' of the phase sensing network. When the phases are in sequence 1-2-3, then no voltage will occur between the junction x' between resistors R5 and R6 and the center or neutral connector N of the three-phase network, provided the resistors R5, R6 and C2 are exactly matched to each other. This is hardly ever the case in industrial practice due to manufacturing tolerances; a voltage divider is provided between the junction x' and the center connector N to compensate for manufacturing inaccuracies. The voltage divider includes a discharge or glow tube G and a resistor R4. This ensures that no voltage will occur across the resistor R4 until the ignition or firing voltage of the discharge tube G is reached. Current will flow only when the firing voltage is exceeded. At this instant, a voltage will occur across resistor R4 which is transferred to the input terminals c, c' of the audio test apparatus P. This voltage must, additionally, exceed the Zener voltage of Zener diode Z' connected between junction y' and terminal c'.

The transfer switch U" is here shown as an open-closed switch. When used for voltage measurements, the switch is connected to engage terminals a' and b', so that the Zener diode Z' will then be across input terminals c, c', in series with resistor R4.

Figure 3:
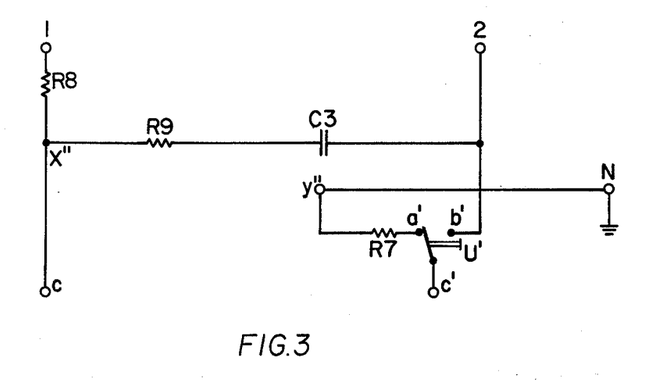
FIG. 3 is another fragmentary diagram illustrating an arrangement using a minimum of components.

FIG. 3 illustrates yet another embodiment in which a minimum of components are used. The phase-sensitive bridge network includes the resistors R8 nd R9 and capacitor C3. It essentially corresponds to the connection of FIG. 2, with the exception that transfer switch U has been omitted and is replaced by a fixed connection connecting terminal x" and input terminal c of the audio tone generator P directly. Only one transfer switch U' is used. Upon operation of transfer switch U', the output terminal c' of the acoustic test generator P is directly connected to terminal 2 to test for electrical voltages or continuity, as discussed in connection with FIG. 1. Terminal c is connected to terminal 1 through resistor R8.

The various elements of the multivibrator in the audio test generator P must consider the addition of the resistance of resistor R8 so that it will still properly operate when testing for external voltages or continuity of the networks. If this embodiment is used, then the input coupling resistor R14 in the audio test generator P is preferably omitted.

Operation: Let it be assumed that transfer switch U' is in the position shown. The test instrument then will provide an indication of the bridge voltage between the junction x" and the connection N of the center or star neutral terminal N of a three-phase network. The test generator P will respond directly to input voltage connected across terminals c, c', a breakdown voltage element has been omitted; resistor R7 will, however, prevent response of the test generator P with respect to small voltages between the junction x" and the neutral connector N, which forms the output terminal y"of the bridge. Resistor R7 will also prevent response due to the low internal resistance of a three-phase system connected between the center or star terminal N and the phase terminal 1 of an external network. The resistor R7, in the position of transfer switch U' shown in FIG. 3, is connected between the terminal c' of the test generator P and the center or star terminal N of the three-phase network. It must be dimensioned to have such a value that the multivibrator in the test generator P is disabled if it were connected directly across terminals c, c'.

If the three-phase network does not have a phase sequence 1-2-3, i.e. 1-3-2, then the junction points x" and y" will have a voltage appear thereat which is the composite of two partial voltages. The higher one of the partial voltages is dropped across resistor R7; the lower one of the partial voltages will become effective across the test generator P and will appear across the terminals c, c'. Since this is an a-c voltage, it will add with one half wave to the voltage of the local battery B of the test generator P; the multivibrator thus can function during each half wave and will provide an output modulated by twice the frequency of the power network.

If two external conductors are connected in proper phase sequence, namely 1-2-3 then, if the components are exactly dimensioned, no resulting voltage will occur across the terminals $c''$, $y''$. Partial voltages thus will not arise across the resistor R7 and the inner resistance of the multivibrator, since the resistor R7 is so large — as above stated — that the multivibrator cannot operate with the resistor connected thereacross. Thus, the loudspeaker will be silent, and the silence will be an indication of proper phase connection 1-2-3.

Due to manufacturing tolerances, small resulting voltages can be expected to arise, and thus the current has to be considered which is necessary in order to render the multivibrator active, that is, to permit oscillation of the generator P. The resistor R7 thus must be so dimensioned that the current which causes multivibrator P to just commence oscillating is not reached, in spite of manufacturing tolerances with the resistance of the network.

Figure 4:
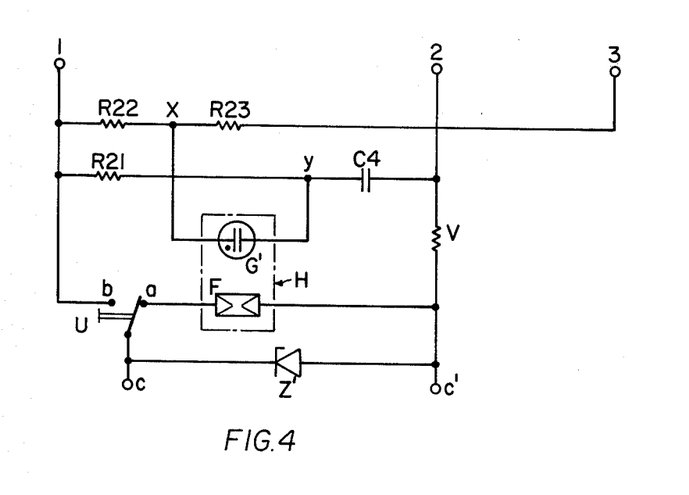
FIG. 4 is a fragmentary diagram illustrating yet another form of a bridge network using a dark-resistance conductor.

Embodiment of FIG. 4: The phase-shifting network of FIG. 4 is similar to that of FIG. 1; resistors R21, R22, R23 and capacitor C4 are connected as in FIG. 1 and have terminals $x$, $y$ across which a voltage appears, or does not appear, depending on relative phase rotation. An additional coupling resistor V is provided. Presence or absence of a voltage across terminals $x$, $y$ is sensed by an opto-electric coupler comprising an optically emitting glow lamp G' which is in optically coupled relation to a dark conductor resistor F included in a shielded housing H. The transfer switch U on the apparatus transfers the type of measurement from phase sequence to external circuit condition.

Operation: The inter-phase voltages between terminals 1 and 3 are divided by the resistors R2, R3 which form a voltage divider. The phase position of the inter-phase voltage at terminal $x$ is therefore not changed with respect to the phase position of the voltages across terminals 1, 3. The bridge arms R1, C1, connected between terminals 1, 2, not only provide for voltage division, but further, by suitable dimensioning of the resistance values, a phase shift at junction $y$ of 60°-el. The divided voltages at terminals x and y are then in phase opposition if the phase sequence is with respect to the terminals 1-2-3. At opposite phase sequence, that is, phase sequence 1-3-2 (which equals 3-2-1), the counter-phase condition would occur between terminals 2 and 3 with respect to junction $y$, rather than between terminals 1 and 3; this condition will be discussed in connection with FIG. 5.

Assuming switch U to be in the position shown in FIG. 4, and the phase sequence being 1-2-3, no voltage will occur between junctions $x$, $y$, and thus lamp G will be extinguished. The dark-resistance of resistor F will be high and therefore the oscillator will not oscillate. If, only two of the phases 1, 2, 3 have the voltage applied thereto, regardless of whether the voltage is a line, delta-connected voltage or a phase voltage to the center or neutral or star point of a star-connected three-phase network, the lamp G will ignite and provide an optical output. The optical output, in turn, so drops the resistance of dark-resistor F that, assuming suitable circuit dimensioning, the multivibrator tone generator oscillator p will start to oscillate and a tone will be available from loudspeaker L. The indicating instrument, by an output tone, thus provides an indication that either the phase sequence is not 1-2-3, or that any one of the phases is not properly connected, or one of the phases is absent. Of course, if the circuit should be entirely dead, that is no voltage at any one of the terminals then, also, no output will be derived with the switch in position shown.

The brightness of the glow lamp G is dependent on the current flowing therethrough, that is, on the voltage between the terminals $x$, $y$. The resistance of indicating element F thus changes with the voltage across terminals $x$, $y$, and this dependence can be made use of to provide an indication of voltage thereacross, since the resistance value of resistor F will influence the pitch of the tone emitted by loudspeaker L. This feature, then, permits distinguishing by the pitch of the tone whether all three of the phases 1, 2, 3 are current-carrying, but not in the phase sequence 1-2-3, or if power is available at only two of the connections. Inter-phase voltages and phase voltages can, therefore, be distinguished by the height or pitch of the tone from loudspeaker L. Thus, first connecting terminals 1 and 2 and listening for the tone and then connecting terminal 3 will, if the tone then disappears, be indicative of proper phase sequence, with respect to the terminals, namely of 1-2-3. Change in pitch will be indicative of improper phase sequence, but energization of all three terminals.

Operation, with transfer switch U in connected position $b$-$c$ (not shown in FIG. 4): The apparatus is now suitable for use as a continuity and resistance measuring device, with the tone generator P providing output indicative of continuity of a circuit connected to terminals 1, 2, or 3, respectively, resistance of such a circuit, or the presence of extraneous voltages applied thereto.

In a first mode of operation, terminals 1 and 2, only, are used. Terminal 3 is not used. If, however, the element to be tested is subject to damage by current flow from the local battery B, for example, if the elements are suspected of being delicate, then the terminals 2 and 3 are used, the resistors R2, R3 functioning as additional current-limiting resistors.

The resistance of an externally connected circuit will determine the current flow from local battery B through the transfer switch terminals $b$-$c$, the coupling resistor V, and a circuit connected across the input terminals $c$, $c'$ of the tone generator P. Thus, the pitch of the tone from loudspeaker L will be representative of the input resistance across terminals 1, 2. Likewise, should terminals 2, 3 be used, the resistance across these terminals will determine the pitch of loudspeaker L as modified by the resistance of the resistors R2, R3.

The apparatus can additionally be used to determine the presence and nature of an externally connected voltage connected between terminals 1, 2, or between terminals 2, 3. Zener diode Z then is used and effective. Depending on the polarity of an external voltage applied, for example, between terminals 1, 2, the Zener diode will have a voltage thereacross which either is its normal conductive voltage or the inherent Zener voltage. If the external voltage is of the polarity so that the Zener diode will operate at its forwardly conductive voltage, then this voltage will, effectively, be an additional voltage in series with the local battery B. The tone generator P will oscillate at full strength, with a predetermined pitch determined by the external circuit parameters. If, however, the input voltage is reversely poled, then the Zener voltage Z will be effective across terminals $c$, $c'$, so that the tone generator TG will fail to oscillate. If the input voltage is an alternating voltage, the tone generator P will oscillate, modulated by the frequency of the applied alternating voltage, the Zener diode Z alternately blocking and conducting. The output from loudspeaker L will, therefore, be additionally modulated by the input voltage, or provide a beat frequency output.

The pitch of the tone and the nature of the tone emitted from loudspeaker L, therefore, are indicative of the nature of an externally applied voltage and, if d-c, then of its polarity.

Figure 5:
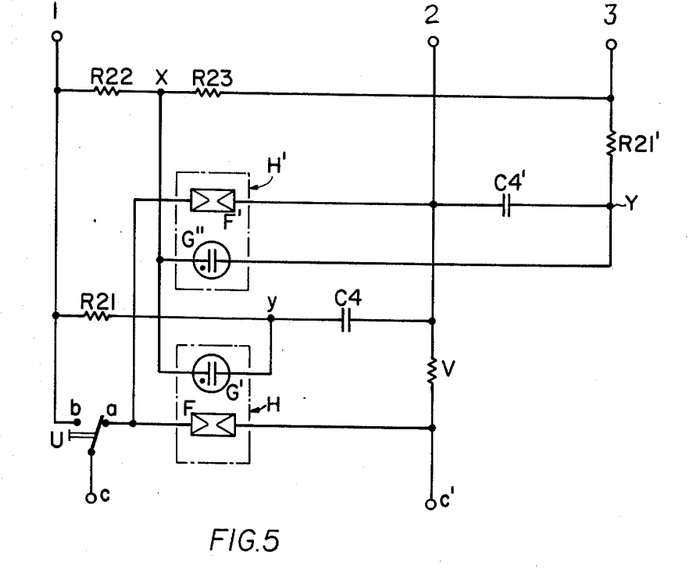
FIG. 5 is a fragmentary circuit diagram illustrating a modification of the arrangement of FIG. 4, the concept of which is equally applicable to the phase recognition networks of FIGS. 1–3, in which the bridge circuit is duplicated.

FIG. 5 illustrates a further embodiment, in which the bridge circuit is duplicated between the phases. Besides the bridge circuit of the elements of FIG. 4 — which have been given the same reference numerals — an additional phase shift circuit with similar reference numerals with prime notation is connected between terminals 2, 3. The optical indicating element G" is connected between points X and Y, and is optically coupled with dark-resistance photo resistor F', located in a housing H' shielding resistor F' from external light.

Conductor F' is connected directly in parallel to photoconductor F with one terminal thereof; the other terminal is connected through the coupling resistor V. The tone generator P is identical to that described in connection with FIG. 1 and is connected to terminals c, c'.

Operation, and output under different input conditions:

1. No input voltages at all at any one of the terminals 1, 2, 3: No output from either lamp G" or G'; thus, high dark-resistance of both photoconductors F, F', non-oscillating conditions of tone generator P, since the dark-resistances of the two photoconductors are too high to permit its oscillation. No output from loudspeaker L.

2. A-C voltage across any two terminals only, that is, terminals 1, 2; 2, 3; or 1, 3: Both lamps G", G' operating, both photoconductors F, F' conductive and, since connected effectively in parallel, operation of tone generator P at highest design frequency providing highest pitch output from loudspeaker L.

3. Three-phase voltages applied to terminals 1, 2, 3 in phase sequence 1-2-3: Lamp G' extinguishes; lamp G" continues to be lit, however. Photoresistor F will have its high dark-resistance, but tone generator P will oscillate at a frequency controlled by the resistance of the illuminated, low resistance of photoconductor F' and the resistance of coupling resistor V. The frequency will be low and the tone output from loudspeaker L will be a low-pitched growl tone.

4. Three phase voltage applied, phase rotation 3-2-1: Lamp G" will extinguish, but lamp G" will light. The photo resistor F' will be at high resistance, but photo resistor F will be at low resistance. Since the reflected input impedance at terminals c,c' will now not be modified by the coupling resistor V, tone generator P will oscillate at a frequency which is higher than the low growl of the condition under (3) above, but lower than the pitch of oscillation if only one phase is connected, as explained in condition (2) above.

In summary: No tone: no power applied; high pitch: one phase conductor disconnected; medium pitch: improper phase sequence; low growl: proper phase connection, circuit terminals properly operating.

The apparatus of FIG. 2 can, of course, similarly be used for resistance measurement and to measure the nature of applied extraneous voltages to terminals 1, 2, 3, as explained in connection with FIG. 4, with the transfer switch U placed in the connecting position b-c.

The embodiment described in connection with FIG. 5 utilized the optical-dark-resistance coupler as a means to sense the voltage across terminals x, y and x, Y. Of course, other sensing elements can be used, such as the system described in connection with FIG. 1, using a Zener diode; FIG. 2, using a glow tube G; or FIG. 3, using merely a properly adjusted resistor R7 (in the light of expected voltages). In the embodiments of FIGS. 4, 5, the second transfer switch U' can be omitted; coupling resistor V can take the place of resistor R14 within the tone generator P itself, which resistor R14 is then desirably omitted. The arrangement of FIG. 5 has the advantage that an output will be obtained even if the phase sequence is proper — at a different pitch, however, if the phase sequence is improper, due to the difference in energization level of the tone generator P effected by the voltage drop across resistor V which is present in one case, but not in the other — compare operating modes 3 and 4 discussed in connection with FIG. 5. Complete absence of a tone will thus indicate absence of energization.

The apparatus permits safe checking of circuits even energized with higher voltages, since the attention of the user need not be diverted from connection or test leads to an indicating instrument; the tone, and nature of the tone generated by the instrument is representative of phase rotation or other circuit conditions, permitting the operator to devote his entire attention to manipulation of the test leads. Since the indication is instantaneous, testing time is decreased, since sequential steps of connection and reading of an instrument are no longer required.

An example of a circuit in accordance with FIG. 1 was built with the following parameters:

380V Nominal voltage of three-phase network between terminals 1, 2, 3: resistors: R1 100kΩ; R2 1MΩ; R3 750kΩ;
  capacitor C1 0.022μF
  Zener diode Z, breakdown voltage: 30V
  transistors T1 BC168C;
  T2 BC168C;
  resistors R11 1.2kΩ;
  R12 36kΩ;
  R13 6.8kΩ;
  capacitors C11 0.033μF;
  C12 6.8nF;
  resistor R14 150Ω;
  loudspeaker L, inductance: 0.4mH
  battery voltage B: 4.5V.

In the embodiment of FIGS. 2 and 3, the following values were found appropriate:
  resistors R5, R8: 33kΩ;
  R6, R9: 33kΩ;
  capacitor C2: 0.1μF
  resistor R4 1MΩ;
  R7 3.3MΩ.

Various changes and modifications may be made, and features described in connection with any one of the embodiments may be used with any of the others, within the scope of the inventive concept.

I claim:

1. Multi-phase power system audio output test apparatus, particularly for use with three-phase systems, comprising
  at least three test input terminals (1, 2, 3);
  a tone generator oscillator circuit (P; T1, T2, C11, C12, R11-R13; L) having a local power source (B) and an audio reproducer (L);

a phase-shifting circuit (R1, C1; R5, R6, C2; R9, C3; R21, C4) connected across a first combination (1, 2) of any two of the test input terminals, and connected across one of the phases (1, 2);

circuit means (R2, x, R3; N; R22, x, R23) connected to a second one of the phases and deriving a separate phase signal; and voltage sensing means (Z, G, R7, G'-F) having one terminal connected to said phase-shifting circuit and a second terminal being controlled by the separate phase signal, the phase-shifting circuit providing a phase-shifted output to the voltage sensing means to cause the said voltage sensing means to have a predetermined output level when the phase sequence is in a first sequence (1-2-3) and to have another output level when the phase sequence differs from said first sequence (1-3-2), the output of the voltage sensing means being coupled to the tone generator oscillator circuit (P) to cause oscillation thereof at a predetermined frequency to generate a tone of predetermined pitch for reproduction by the reproducer (L) when the phase sequence has a predetermined one of said phase sequences, absence of reproduction of said tone due to oscillation at another frequency, or at other frequencies, or a non-oscillation of the oscillator circuit (P) being an indication of another predetermined phase sequence or circuit condition.

2. Apparatus according to claim 1, wherein the output level of the voltage sensing means, when the phase sequence is in the first predetermined sequence, is zero or null and therefore does not provide output to inhibit oscillation of the tone generator oscillator circuit (P) to indicate said first sequence by absence of a tone.

3. Apparatus according to claim 1, wherein the output level of said voltage sensing element, when the phase sequence has the second predetermined sequence, is sufficiently high to set the tone generator oscillator (P) into oscillations at a predetermined frequency and generate an audible tone at a predetermined pitch from the reproducer (L) to indicate said second phase sequence.

4. Apparatus according to claim 3, further comprising coupling resistance means (R14; V; R7) in circuit with one (2) of the input test terminals (1, 2, 3);

and switch-over means (U,U') selectively switching the tone generator oscillator (P) to the coupling resistance means (V) and another one (1) of the test input terminals (1, 2, 3) and disconnect the voltage sensing means to apply a reflected impedance connected to the switch-over means in lieu of the voltage sensing means to the tone generator oscillator (P) to obtain an audible output representative of said reflected impedance.

5. Apparatus according to claim 4, wherein the reflected impedance connected to the switch-over means (U) is a frequency-determining impedance for the tone generator oscillator (P) to provide a selective acoustic output signal;

1. when the switch-over means (U) is in the position connecting the voltage sensing means in circuit with the tone generator oscillator (P),    a. if the voltage sensing means has no voltage thereacross, indicative of absence of voltage between the phase-shifting element and the first combination of terminals (1-2) and a second combination of terminals (1, 3), the oscillator (P) will fail to oscillate and absence of tone is indicative of a first phase sequence;

b. if the voltage sensing means is energized, indicative of presence of voltage between the phase-shifting element connected to the first combination of terminals (1,2) and a second combination of terminals (1, 3), the oscillator will oscillate at a predetermined frequency indicative of the second phase sequence; and 2. when the switch-over means (U) is in the position connecting the coupling resistance means (R4; V; R7) and two of the input terminals (1, 2) in circuit with the tone generator oscillator (P),    c. if the circuit connected to the input terminals is open, the oscillator will fail to oscillate, indicative of open-circuit condition; and    d. if the circuit connected to the input terminals has low-resistance values, the oscillator (P) will oscillate and the audio reproducer will provide a tone, the pitch of which is representative of said impedance value.

6. Apparatus according to claim 5, further comprising a Zener diode (Z') connected to the power source (B) and across the input terminals (c, c') of the tone generator oscillator (P) and poled in a direction opposite the polarity of the power source (B) to provide that, when the switch-over means (U) is in the position connecting the coupling resistance (R14; V; R) and two of the input test terminals (1, 2) in circuit with the tone generator oscillator (P), and    e. if the circuit connection to the input terminals (1, 2) has a d-c value applied thereto of a first polarity additive to that of the power source (B), the oscillator (P) will oscillate and the audio reproducer (L) will produce a tone indicative of such polarity;

f. if the circuit connected to the input terminals has a d-c voltage applied thereto of a second polarity reverse to that of the first polarity and bucking that of the power source (B), the oscillator (P) will fail to oscillate and the audio reproducer (L) will provide no tone, indicative of said reverse polarity; and    g. if the circuit connection to the input terminals (1, 2) has an a-c voltage applied thereto, the oscillator will oscillate and will be modulated by the frequency of the a-c source so that the audio reproducer will provide an output tone representative of the a-c voltage applied as modulated by the frequency of said applied a-c voltage.

7. Apparatus according to claim 1, wherein the circuit means comprises a resistor voltage divider (R2, R3) connected between the other one of the combinations (1-3) of the phases, the voltage sensing means being connected to the tap point (x) of the voltage divider.

8. Apparatus according to claim 4, wherein the circuit means comprises a resistor voltage divider (R2, R3) connected between the other one of the combination (1-3) of the phases, the voltage sensing means being connected to the tap point (x) of the voltage divider to provide, when the switch-over means (U) is in the position connecting the coupling resistance (V) and one of the input test terminals (1, 2) in circuit with the tone generator oscillator (P), that another one (3) of the terminals of said one combination (1-3) will be connected through the voltage divider resistance, the coupling resistance (V) being connected to a terminal other than said first combination of two terminals (1, 3) to place the additional resistance of the series connected voltage divider resistors in circuit with the input terminals (c, c') to the tone generator (P), so that h. sensitive components of low current-carrying capacity can be tested without danger of damage thereto by the current supplied by the local power source (B), the resistance (R2, R3) of the voltage divider limiting the locally supplied test current.

9. Apparatus according to claim 1, further comprising a second phase-shifting circuit (R1', C1') connected across the third combination (2, 3) of two test terminals and connected across the third one (2-3) of the phases;

and a second voltage sensing means (G''-F') connected to said second phase-shifting circuit (R1', C1') and the second combination (1, 3) of any two test input terminals connected across the second one of the phases (1-3), the second phase-shifting circuit providing a phase-shifted output to said second voltage sensing means to cause said second voltage sensing means to have a predetermined output level in accordance with phase sequence, the output of said second voltage sensing means being coupled to the tone generator (P) to cause oscillation of the oscillator thereof;

and a coupling resistor (V) connecting the first voltage sensing means (Z, G, R7, G'-F) and the tone generator (P), to provide:

i. if no alternating currents are applied to the three terminals (1, 2, 3), neither the first nor the second voltage sensing means will have a voltage thereacross, and the tone generator (P) will not oscillate, and hence no audio output will be provided by the reproducer (L);

ii. if two terminals of three terminals (1, 2, 3) only have an alternating voltage applied, both voltage sensing means will sense presence of voltages, causing the tone generator (P) to oscillate at a first extreme frequency and the reproducer (L) will provide an output tone at a first extreme pitch;

iii. if three terminals are energized and the phase sequence applied to the three terminals is in one direction, one of the voltage sensing means (G'-E') will sense presence of a voltage, and the other voltage sensing means (G'-F') will not sense presence of a voltage, the reflected impedance to the tone generator of the combination of the outputs of both voltage sensing means being determined by the voltage supplied by the first voltage sensing means, as dropped over the coupling resistor (V) to cause the tone generator (P) to oscillate at a low frequency and provide from the reproducer (L) a low pitch tone or growl; and iv. if the phase sequence is opposite that of condition (iii) above, the second voltage sensing means (G''-F) will sense a voltage, and the first voltage sensing means (G'-F) will not sense a voltage, the reflected impedance to the tone generator of the combination of the outputs of both voltage sensing means being determined, solely by the voltage of the second voltage sensing means (G'''-F) to cause the tone generator (P) to oscillate at a frequency lower than that of condition (ii) above, but higher than that of condition (iii) above, to cause the reproducer (L) to provide an output tone having a pitch intermediate that of an extreme value and a low growl.

10. Apparatus according to claim 9, further comprising switch-over means (U) selectively switching the tone generator oscillator (P), and connecting, selectively, the coupling resistance (V) and the other one (1) of the test input terminals, while disconnecting both the first and second voltage sensing means to apply a reflected impedance to connect to the swtich-over means in lieu of the respective or both voltage sensing means to the tone generator oscillator (P) and to obtain an audible output from said reproducer (L) representative of said impedance.

11. Apparatus according to claim 10, further comprising a Zener diode (Z') connected across the power source (B) and across the input terminals (c, c') of the tone generator (P), and poled in a direction opposite the polarity of the power source (B).

12. Apparatus according to claim 1, wherein the circuit means comprises a resistance voltage divider (R2, R3) connected across the second combination of terminals (1, 3), the phase-shifting circuit (R1, C1) being connected across the first combination (1, 2) of the test input terminals and the voltage divider, together, forming a phase-shifting bridge circuit, the voltage sensing means connected across the diagonals (x-y; x'-y'; x''-y''; x-Y) of the bridge circuit.

13. Apparatus according to claim 1, wherein the voltage sensing means comprises a dark-resistance photoconductor (F, F') in circuit with the tone generator (P) and determining, in dependence on its resistance condition, the oscillatory state of the oscillator circuit (P) and the frequency of oscillation thereof;

and an electrical voltage-optical output transducer (G, G') optically coupled to the dark-resistance photoconductor (F, F') and having an optical output representative of voltage applied thereacross.

14. Apparatus according to claim 13, wherein the optical output of the voltage-optical transducer occurs only when the voltage exceeds a predetermined threshold level.

15. Apparatus according to claim 1, wherein the voltage sensing means comprises means responsive to voltage in excess of a predetermined minimum threshold level.

16. Apparatus according to claim 1, wherein said voltage sensing means comprises a voltage controlled semiconductor (Z).

17. Apparatus according to claim 1, wherein said voltage sensing means comprises a discharge tube (G).

18. Apparatus according to claim 1, wherein said voltage sensing means comprises a resistor (R7) of a value which, when solely connected across the input terminals (c, c') of the tone generator oscillator circuit (P), is of such high resistance that the tone generator oscillator circuit will not oscillate.

19. Apparatus according to claim 12, wherein the voltage sensing means comprises the combination of a resistor (R14; V) and a voltage threshold element (Z; G, G'-F) responsive only to voltages exceeding a predetermined level, to prevent small voltages arising in the phase-shifting bridge circuit due to manufacturing tolerances of the resistors of the resistance voltage divider and of the resistor and the capacitor of the phase-shifting circuit from being transferred to the tone generator and falsify its output.

20. Audio output test instrument to test, selectively, three-phase networks for energization and circuit conditions including phase sequence, voltage, continuity, comprising
  a balancing circuit having two branches,
  one branch comprising two series connected resistors (R2, R3; R5, R8, R9; R22, R23) having a common junction (x, x', x") forming one output terminal of the balancing circuit, said one branch being connected across a first combination of any two phase terminals of the three-phase network, the other branch comprising a phase-shifting capacitor (C1, C2, C3, C4) and circuit means connected to said capacitor, the junction (y, y', y"; Y) of said capacitor and said circuit means forming another output terminal (y, y', y"; Y), of the balancing circuit, said other branch being connected to a second combination of any two terminals of the three-phase network, the capacitor (C1, C2, C3, C4) and the resistors, and said circuit means being dimensioned relative to each other to provide phase-shifting of voltages applied to said terminals to result in a minimum voltage between the output terminals (x-y; x'-y'; x"-y"; x-Y) of said two branches when the phase sequence of the voltage of the network is in a first direction (e.g.: 1-2-3) and having a value differing substantially from said minimum value when the phase sequence is reversed (1-3-2);

a tone generator oscillator circuit (P) having a local power source (D) and an audio tone reproducer (L), the tone generator oscillator having two input terminals (c, c') and being internally dimensioned such that it will not spontaneously self-oscillate unless said two input terminals (c, c') have a voltage applied thereacross of a predetermined level;

and means (Z, R14, G, R4; R7; G'-F; U, U') connected to and sensing the voltage across said balancing circuit output terminals (x-y; x'-y'; x"-y"; x-Y) and applying a sensed and connected voltage to said oscillator input terminals whereby the oscillation condition of said oscillator tone generator (P) will be controlled to cause the oscillator to oscillate or not, and, if oscillating, its pitch or frequency of oscillation, in dependence on the voltage connected across the oscillator input terminals (c, c'), and the audio output from the reproducer will be an indication of the voltage level connected across said oscillator input terminals and hence of the phase sequence of the three-phase network, or of other network conditions.

21. Instrument according to claim 20, wherein (FIGS. 1, 4, 5) the series connected resistors (R2, R3; R22, R23) of the balancing circuit are connected between two phase connections of the three-phase network; the capacitor (C1, C4) and a first resistor (R1, R21) forming the circuit means are series connected between one of the two phases and the third phase, the junction between said capacitor (C1, C4) and the further resistor (R1, R21) forming the second output terminal (y, Y).

22. Instrument according to claim 20, wherein (FIG. 2) the series connected resistors (R5, R6) forming said one branch are connected in series with the capacitor (C2) to form a three-element series connection, the end terminals of which are connected between two phase terminals of the three-phase network, the junction (x) between said resistors (R5, R6) forming said one output terminal (x'), the circuit means include means (R4) connected to the center or neutral terminal (N) of a star-connected three-phase network;

said center or neutral terminal (N) forming said other output terminal (Y').

23. Instrument according to claim 20, wherein a voltage divider circuit is connected between the output terminals (x, y; x', y'; x", y"), said voltage divider including a resistor and a voltage controlled element (Z, G) having Zener diode characteristics, the input terminals (c, c') of the tone generator oscillator (P) being connected to the voltage division point of the voltage divider to prevent transfer of sensed voltages between said output terminals of values below the voltage response of the voltage controlled element.

24. Instrument according to claim 20, wherein the means sensing the voltage across the output terminals comprises a resistor (R7) of a resistance value so high that connectio thereof across the input terminals (i c, c') of the tone generator oscillator circuit (P) will not trigger said oscillator into oscillatory condition;

said resistor (R7) being connected in series with one (c') of the input terminals (c, c') of the tone generator oscillator circuit (P) and one of the output terminals (Y"; N) and also forming the center or neutral terminal (N) of a star-connected three-phase network, the other one (c) of the input terminals of the tone generator oscillator being connected to the other one (x") of the output terminals.

25. Instrument according to claim 20, wherein said instrument has test terminals;

further comprising transfer switch means (U, U') selectively connecting the input terminals (c, c') of the tone generator oscillator circuit (P) directly to said input test terminals or alternatively to the balancing circuit output terminals (x, x', x"; y, y', y", Y).

26. Instrument according to claim 23, wherein said instrument has test terminals;

further comprising transfer switch means (U, U') selectively connecting the input terminals (c, c') of the tone generator oscillator circuit (P) directly to said input test terminals or alternatively to the balancing circuit output terminals (x, x', x"; y, y', y", Y);

and wherein one (c) of the input terminals (c, c') of the oscillator circuit (P) is connected to the common junction of the two series connected resistors (R2, R3; R5, R6; R22, R23) and forming the first output terminal, the other input terminal (c') of the tone generator oscillator (P) being connected through the transfer switch (U'), selectively, to the junction point of the voltage controlled element (Z, G) and the resistor (R14, R4, V) connected in series thereto so that the transfer switch, upon connection to an instrument terminal, places the resistor (R14, R5) in series connection to the tone generator oscillator to form an input resistor thereto, and the phase terminals of the instrument can be used, selectively, to test for voltage or continuity of an external network connected to the test terminals.

27. Instrument according to claim 24, wherein said instrument has test terminals;

further comprising transfer switch means (U, U') selectively connecting the input terminals (c, c') of the tone generator oscillator circuit (P) directly to said input test terminals or alternatively to the balancing circuit output terminals (x, x', x"; y, y', y", Y);

and wherein one (c) of the input terminals (c, c') of the tone generator oscillator (P) is connected to the common junction of the two series connected resistors (R8, R9) forming the first output terminal (x"), the other (c') one of the input terminals of the tone generator oscillator (P) being connected in series with the resistor (R7) of high-resistance value through the transfer switch when the transfer switch is placed in condition to measure phase sequence, and directly to a measuring terminal of the instrument when the transfer switch is placed into position for measuring of voltage or continuity conditions of an external network connected to the test terminals, one (R8) of the series connected resistors (R8, R9) forming an input resistor to the tone generator oscillator (P).

28. Instrument according to claim 20, wherein (FIG. 4) the voltage sensing means comprises an optical-electrical coupler (G'-F).

29. Instrument according to claim 20, wherein two phase-shifting capacitors (C4, C4') are provided, forming two phase-shifting networks, connected to respectively different phase terminals of the three-phase network to provide an additional balancing circuit output terminal (Y) having a bridge voltage differing from that of the first output terminal (y);

and coupling means (V, R14) of different impedance value coupling the output from each said first (y) and additional (Y) terminals to said voltage sensing means to provide output from said tone generator of different pitch in dependence on the voltage coupled to the two input terminals (c, c') by the respective one of said coupling means to distinguish phase sequence by difference in pitch in output tone from the tone generator oscillator circuit (P).

30. Apparatus according to claim 6, wherein the Zener diode (Z') also forms the voltage sensing means when the switch-over means (U) is in the position connecting the voltage sensing means in circuit with the tone generator oscillator (P).

* * * * *